United States Patent [19]

Tatsukami et al.

[11] Patent Number: 4,843,113

[45] Date of Patent: Jun. 27, 1989

[54] AROMATIC POLYSULFONE RESIN COMPOSITION HAVING EXCELLENT PLATING CHARACTERISTICS

[75] Inventors: Yoshiharu Tatsukami, Toyonaka; Masakazu Inoue, Shiga; Kuniaki Asai, Tondabayashi; Kazuo Hieda, Nishinomiya, all of Japan

[73] Assignee: Sumitomo Chemical Company, Limited, Osaka, Japan

[21] Appl. No.: 166,379

[22] Filed: Mar. 10, 1988

[30] Foreign Application Priority Data

Mar. 24, 1987 [JP] Japan ................................. 62-70942

[51] Int. Cl.[4] ........................... C08K 3/26; C08K 3/34
[52] U.S. Cl. ................................... 524/425; 523/212;
523/213; 524/424; 524/456
[58] Field of Search ...................... 524/424, 425, 456

[56] References Cited

U.S. PATENT DOCUMENTS 3,503,168  3/1985  Hartsing, Jr. ....................... 524/425
4,520,067  5/1985  Harris et al. ....................... 428/323
4,743,645  5/1988  Harris et al. ....................... 524/456

FOREIGN PATENT DOCUMENTS 38959  10/1981  European Pat. Off. ............ 524/456
60-23448  2/1985  Japan .
61-281151  12/1986  Japan .

Primary Examiner—Lewis T. Jacobs
Assistant Examiner—David W. Woodward
Attorney, Agent, or Firm—Stevens, Davis, Miller & Mosher

[57] ABSTRACT

An aromatic polysulfone resin composition with excellent plating characteristics comprising:
(A) 50 to 90% by weight of an aromatic polysulfone,
(B) 3 to 40% by weight of wollastonite of which 90% by weight or more of the total amount have a particle size smaller than 300 meshes, and
(C) 3 to 30% by weight of an alkaline earth metal carbonate is disclosed.

This aromatic polysulfone resin composition has excellent mechanical properties, thermal properties (in terms of thermal deformation temperature and linear thermal expansion coefficient), dimensional stability, thermal stability during processing and surface smoothness and also shows excellent plating characteristics in a wide range of plating conditions (etching conditions). By using this aromatic polysulfone resin composition, it is possible to easily obtain a printed circuit board having a desired configuration by means of injection molding, and it becomes possible to form the circuits with a fine line width.

10 Claims, No Drawings

AROMATIC POLYSULFONE RESIN COMPOSITION HAVING EXCELLENT PLATING CHARACTERISTICS

This invention relates to an aromatic poly-sulfone resin composition having excellent mechanical and thermal properties, dimensional stability and surface smoothness as well as high thermal stability during processing and excellent plating characteristics. Especially, the invention is intended to provide such an aromatic polysulfone resin composition which can advantageously be applied to the molding of printed circuit boards having fine circuit pattern formability.

Aromatic polysulfones are used for electric and electronic parts, automobile parts, OA machine parts, etc., as an engineering plastic with high heat resistance, strength, rigidity, flame retardancy and creep resistance. Recently, studies are being made ardently for the application of this resin as a material for printed circuit boards.

The printed circuit boards in popular use are currently made by bonding a copper foil to a laminate comprising glass cloth impregnated with a thermosetting resin such as epoxy resin or polyimide resin, and subjecting this copper-clad laminate to such treatments as formation of resist pattern, etching and removal of resist pattern to form the desired electric circuits. This method, however, necessitates troublesome mechanical works such as drilling, beveling, blanking for mounting circuit parts and contouring. In case of using aromatic polysulfone, it has in itself enough heat resistance, strength, rigidity and electrical properties to serve as substrate for said printed circuit boards and it can previously be formed into a desired configuration by injection molding, so that the use of aromatic polysulfone cannot only dispense with such troublesome works as drilling, beveling, blanking and contouring but also makes it possible to produce cubic boards having protuberances, steps, slants or such.

For forming a conductive layer on the surface of a molded article of aromatic polysulfone, it needs to apply plating on said surface. Single use of aromatic polysulfone cannot provide enough strength of adhesion to the metallic deposit formed by plating, so that usually an inorganic filler is incorporated in aromatic poly-sulfone to increase the adhesive strength. Glass fiber and alkaline earth metal carbonates such as calcium carbonate are generally used as such inorganic filler.

In Japanese Patent Application Kokai (Laid-Open) No. 61-281151 is proposed a resin composition composed of aromatic polysulfone, potassium titanate fiber and an alkaline earth metal carbonate.

However, although the compositions prepared by incorporating glass fiber and alkaline earth metal carbonates such as calcium carbonate in aromatic ply-sulfone are capable of providing a high adhesion to the plating, they are poor in surface smoothness. And when such compositions are used for a printed circuit board, it proves impossible to form a fine circuit pattern on the board.

On the other hand, the composition formed by incorporating potassium titanate fiber and alkaline earth metal carbonates such as calcium carbonate in aromatic polysulfone are satisfactory in surface smoothness, but have the problem that they tend to be gelled during retention in the molding machine under a high temperature to lose the fluidity and become incapable of molding under the molding conditions of ordinary melt molding process such as injection molding. Even if they could be molded, the molded product tends to retain a mark of gelation of its surface which, accordingly, would become non-smooth, resulting in bad appearance of the plating surface, low adhesive strength to the plating and dispersion of adhesive strength of each product.

The present inventors had found that this problem could be solved by incorporating potassium titanate fiber with a free potassium content of less than 0.25% by weight and an alkaline earth metal carbonate in said resin, and filed a patent application based on this finding (refer to Japanese Patent Application No. 62-8388). However, the composition proposed in this application is excellent in thermal stability during processing and also has good surface smoothness and high adhesion to the plating, but has the defect that the plating conditions usable therefor are very limited. Generally because the adhesive strength to the plating is greatly affected by the conditions under which etching is conducted, prior to electroless plating, for forming fine unevenness on the surface of said composition by dipping it in a mixed solution of chromic anhydride and concentrated sulfuric acid, in order to obtain a satisfactorily high adhesive strength in use of said composition, it is necessary to keep the temperature of said mixed solution for etching in the limited range of 75° to 85° C. This range of temperature is approximately 15° to 25° C. higher and narrower than the temperature range used in the case of ABS resin which is most widely used at present as plating resin.

An object of this invention is to provide an aromatic polysulfone resin composition having excellent mechanical and thermal properties, dimensional stability and thermal stability during processing as well as satisfactory surface smoothness and, in particular, excellent plating characteristics under the wide range of plating conditions (i.e. etching conditions). The present invention is especially intended to provide such an aromatic polysulfone resin composition which can advantageously be applied to the manufacture of printed circuit boards having a fine circuit pattern formability.

As the result of assiduous studies for attaining said object, the present inventors found that said object can be achieved by providing a composition comprising prescribed amounts of aromatic polysulfone, wollastonite having a specific particle size and a specified alkaline earth metal carbonate.

Thus, according to the present invention, there is provided an aromatic polysulfone resin composition with excellent plating characteristics comprising 50 to 90% by weight of an aromatic polysulfone, 3 to 40% by weight of wollastonite of which at least 90% by weight of the total amount have a particle size smaller than 300 meshes, and 3 to 30% by weight of an alkaline earth metal carbonate.

The aromatic polysulfone used as a primary component of the composition of this invention is defined as a type of polyarylene compounds in which the arylene units are situated irregularly or regularly along with ether and sulfone bonds. Specific examples of such polyarylene compounds are those having the repeating structural units (1)-(16) shown below. Among them, those having the repeating structural units (1), (2) and (6) are preferred because they have good balance of properties and processability. Those of (1) and (6) are more preferable in this invention.

Further, it is preferred in this invention to use aromatic polysulfone having a reduced viscosity in the range of 0.3 to 0.6 as measured at 25° C. in a N,N-dimethylformamide solution containing 1 g of the polymer in 100 ml of the solution because such aromatic poly-sulfone can provide a composition having a good balance of properties such as heat resistance, strength, rigidity, toughness, etc., and moldability.

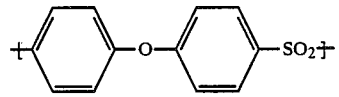 (1)

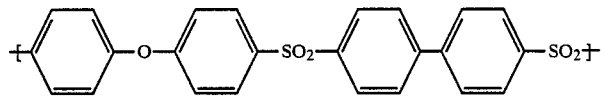 (2)

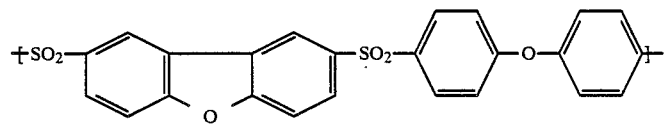 (3)

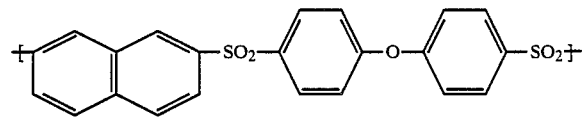 (4)

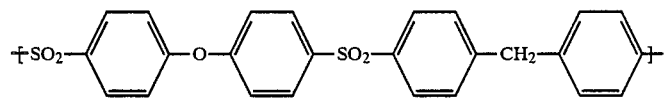 (5)

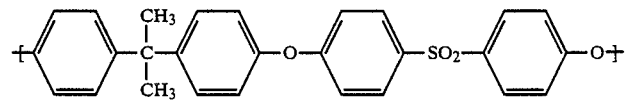 (6)

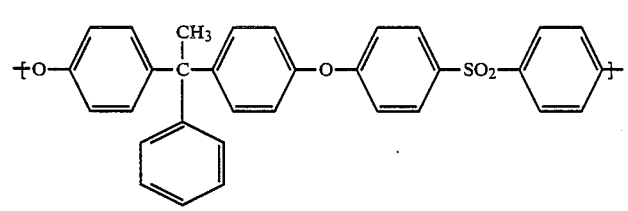 (7)

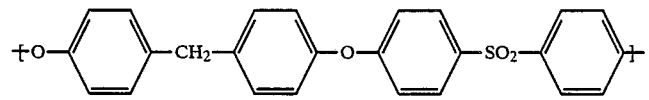 (8)

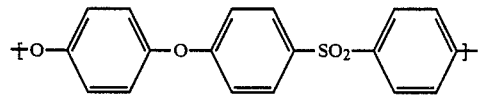 (9)

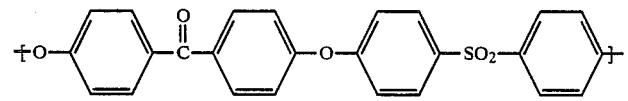 (10)

-continued

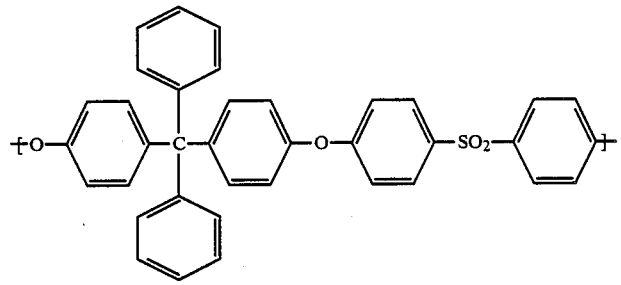
(11)

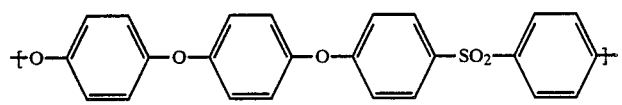
(12)

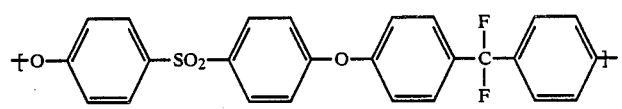
(13)

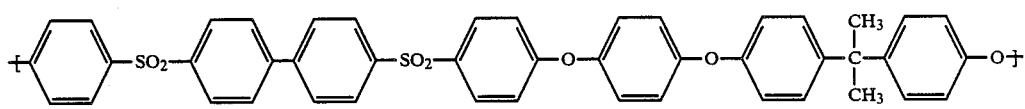
(14)

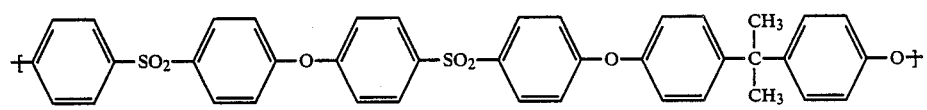
(15)

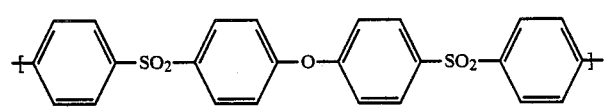
(16)

Wollastonite used in the present invention is calcium metasilicate which occurs in nature. It is a white acicular mineral having a chemical composition of CaSiO₃, which mineral has a specific gravity of 2.9 and a melting point of 1,540° C. It is divided into α type and β type according to the crystal structure. The α type is mostly granular or powdery while the β type is largely needle-shaped or columnar. Both types are usable in the present invention. This mineral is commercially available in pulverized forms which range widely in particle size, but in use thereof in the composition of this invention, it is necessary that at least 90% of the whole amount of wollastonite used are of a particle size smaller than 300 meshes. Preferably 99% or more of the whole amount of wollastonite used should be of a particle size smaller than 300 meshes. In case the amount of wollastonite having a particle size greater than 300 meshes exceeds 10% in its ratio to the total amount of wollastonite used, the following problems tend to arise; the molded article obtained from the composition may prove poor in surface smoothness, causing formation of extremely large surface unevenness of the plating after etching, resulting in very insecure adhesion to the plating. Also, the plating surface becomes poor in appearance, and the composition is deteriorated in its fine circuit pattern formability when it is used for making printed circuit boards.

Wollastonite is usually used as such, but the one which is surface treated with a silane coupling agent such as aminosilane, epoxysilane, etc., for giving affinity for the aromatic polysulfone can be used as far as it does not affect the thermal stability of the composition.

Among the commercial products of wollastonite usable in this invention are NYAD ® 400, NYAD ® 325, NYCOR ® 300 (these three being sold by Nagase & Co., Ltd.), TW-HAR-10 (sold by Tatsumori Co., Ltd.), KEMOLIT ® ASB-3 and KEMOLIT ® ASB-4 (there two being sold by Maruwa Biochemical Co., Ltd.). It is said that KEMOLIT ® is of β type and others are of α type in crystal structure.

As the alkaline earth metal carbonate forming another important constituent of the composition of this invention, there can be used the carbonates of magnesium, calcium, strontium, barium and the like; preferably calcium carbonate, magnesium carbonate or a eutectic mixture of calcium carbonate and magnesium carbonate. The eutectic mixture of calcium carbonate and magnesium carbonate is synonymous with the so-called dolomite.

The composition of this invention comprises 50 to 90% by weight of an aromatic polysulfone, 3 to 40% by weight of wollastonite of which at least 90% by weight of the total amount have a particle size smaller than 300 meshes, and 3 to 30% by weight of an alkaline earth metal carbonate.

Preferably the combined amount of wollastonite and the alkaline earth metal carbonate falls in the range of 10 to 50% by weight based on the total amount of the composition.

When the combined amount of wollastonite and alkaline earth metal carbonate exceeds 50% by weight of the total amount of the composition and the amount of aromatic polysulfone is less than 50% by weight, the resulting composition has no sufficient fluidity, and even if a molded product could be obtained from the composition, such molded product tends to be brittle.

On the other hand, when the combined amount of wollastonite and the alkaline earth metal carbonate is less than 10% by weight of the whole composition, the resulting composition tends to show poor adhesion to the plating.

Even when the combined amount of wollastonite and the alkaline earth metal carbonate is in the range of 10 to 50% by weight, if the amount of wollastonite is less than 3% by weight, the resulting composition also proves unsatisfactory in the reinforcing effect for strenth, rigidity, etc., and in the improving effect for linear thermal expansion coefficient, dimensional stability, etc., as compared with the single body of the aromatic polysulfone. In case the amount of wollastonite exceeds 40% by weight, however, both the molded product and the plating are impaired in appearance.

On the other hand, when the amount of the alkaline earth metal carbonate is less than 3% by weight, no sufficiently strong adhesion to the plating is provided, and when it exceeds 30% by weight, there results a remarkable reduction of strength and thermal stability during processing. Thus, the preferred contents of wollastonite and alkaline earth metal carbonate, based on the total amount of the composition, are 10-30% by weight and 5-20% by weight, respectively.

The means for blending of said components for obtaining the composition of this invention are not critical; such blending can be accomplished, for instance, by supplying aromatic polysulfone, wollastonite and alkaline earth metal carbonate separately into a melt mixer, or by preliminarily mixing said components by a suitable mixing means such as mortar, Henschel mixer, ball mill, ribbon blender, etc., and then supplying the mixture to a melt mixer.

The composition of this invention may contain an ordinarily used additive or additives such as antioxidant, thermal stabilizer, ultraviolet absorbing agent, lubricant, releasing agent, coloring agent such as dye and pigment, flame retardant, flame-retarding assistant, antistatic agent, etc., within limits not prejudiciary to the object of this invention. It is also possible to add one or more of thermoplastic resins (such as polyethylene, polypropylene, polyamide, polyester, polycarbonate, modified polyphenylene oxide, etc.) and/or thermosetting resins (such as phenol resin, epoxy resin, etc.) in small quantities.

Plating of the molded articles from the composition of this invention can be effected, for example, by the following process.

A. ELECTROLESS PLATING (1) Preparation of base

The injection molded article is annealed in an oven with internal air circulation at 180°-200° C. for 3-5 hours.

(2) Degreasing

The annealed molded article is immersed in a 100 ml/l solution of OPC-260 Cleaner L (produced by Okuno Seiyaku Co., Ltd.) at 65° C. for 5 minutes.

(3) Washing with water (4) Etching

The thus treated molded article is immersed in a mixed bath of 400 g/l of chromic anhydride and 220 ml/l of concentrated sulfuric acid at 60°-85° C. for 10-40 minutes.

(5) Washing with water (6) Neutralization

The article is immersed in a mixed solution of 50 ml/l of concentrated hydrochloric acid and 20 ml/l of Top catch CR-200 (produced by Okuno Seiyaku Co., Ltd.) at a room temperature for 5 minutes.

(7) Washing with water (8) Conditioning

The article is immersed in a 30 ml/l solution of OPC-350 Conditioner M (produced by Okuno Seiyaku Co., Ltd.) at 30° C. for 3 minutes.

(9) Washing with water

(10) Predipping

The article is dipped in a 150 ml/l solution of concentrated hydrochloric acid at a room temperature for 2 minutes.

(11) Catalyzing

The article is dipped in a mixed solution of 150 ml/l of concentrated hydrochloric acid and 50 ml/l of OPC-80 Catalyst M (produced by Okuno Seiyaku Co., Ltd.) at a room temperature for 5 minutes.

(12) Washing with water

(13) Accelerating

The article is dipped in a 100 ml/l solution of OPC-555 Accelerator M (produced by Okuno Seiyaku Co., Ltd.) at 28° C. for 7 minutes.

(14) Washing with water

(15) Electroless plating

The article is dipped in a solution of TMP Chemical Copper New 100 (produced by Okuno Seiyaku Co., Ltd.) at a room temperature for 7 minutes to form a 0.3-0.5 μm thick copper film.

B. ELECTROPLATING

Using an electroless-plated article as cathode and phosphorus copper as anode, they are placed in a 200 g/l solution of copper sulfate and an electric current is passed therebetween at a current density of 3 A/dm$^2$ for 110 minutes to form a 50 μm thick metallic deposit on the article.

In case the composition of this invention is applied to printed circuit boards, various methods are available for forming conductive circuits on the board. A typical example is a semi-additive method according to which circuit formation is accomplished through the following steps. The composition of this invention is molded into a desired configuration by injection molding, and the whole surface on which electric circuits are to be formed is subjected to electroless copper plating to form an approximately 0.3-0.5 μm thick copper deposit. Then the negative image of a desired circuit pattern is printed thereon with a resist ink, followed by electroplating on the whole surface (saving the resist ink printed portion) to form an approximately 50 μm thick copper deposit. Next, the resist ink is removed by a resist ink stripping liquid, and finally the copper film formed by electroless plating on the underside of the resist ink printed portion is eliminated by the action of the etching solution to thereby form the desired circuit on the printed circuit board. In this case, the board material is required to have a quality enabling formation of the circuit with a fine line width. Such a requirement is met by the board obtained from the composition of this invention as such board has excellent adhesiveness to the metallic deposit and surface smoothness.

According to the present invention, it is possible to obtain an aromatic polysulfone resin composition having excellent mechanical properties, thermal properties (in terms of heat distortion temperature and linear thermal expansion coefficient), dimensional stability and thermal stability during processing as well as good surface smoothness and excellent plating characteristics under the wide-ranging plating conditions (i.e. etching conditions) by incorporating wollastonite of which 90% by weight or more of the total amount have a particle size smaller than 300 meshes and an alkaline earth metal carbonate in an aromatic polysulfone. It is to be noted particularly that the composition of this invention makes it possible to easily obtain printed circuit boards of desired configurations by means of injection molding and also enables formation of the circuits with a fine line width on the board. Although the present invention has been primarily described relating to its application to printed circuit boards, it goes without saying that the resin composition of this invention can be as well applied to various other uses where plating is involved.

EXAMPLES 1-11

Aromatic polysulfone having the repeating structural units of

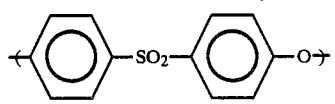

(polyether sulfone VICTREX® PES 3600P produced by ICI, Ltd., reduced viscosity: 0.36), a wollastonite selected from TW-HAR-10 (sold by Tatsumori Co., Ltd., 99% passing through a 325-mesh screen), NYAD® 400 (sold by Nagase & Co., Ltd., 99.9% passing through a 325-mesh screen) and KEMOLI® ASB-3 (sold by Maruwa Biochemical Co., Ltd., 99% passing through a 300-mesh screen), and an alkaline earth metal carbonate selected from calcium carbonate, magnesium carbonate and dolomite were mixed in the amount ratios shown in Table 1, and each mixture was melt kneaded at 330°–340° C. and extruded by a double-screw extruder (PCM-30 mfd. by Ikegai Iron Works, Ltd.), and the produced strand was cooled with water and then cut into pellets.

The pellets thus obtained were injection molded (using Nestal® 47/28 injection molding machine mfd. by Sumitomo Heavy Industries, Ltd., the cylinder temperature being set at 340°–360° C. and the die temperature at 150° C.) to obtain the tensile test pieces, flexual test pieces, Izot test pieces, test pieces for determining thermal deformation temperature, and test pieces for examining plating characteristics (discs of 100 mm in diameter and 1.6 mm in thickness).

The tensile strength, flexual modulus of elasticity, Izot impact strength (unnotched) and heat distortion temperature (under a load of 18.6 kg/cm$^2$) were measured according to ASTM D-638, D-790, D-256 and D-648, respectively.

For determining the linear thermal expansion coefficient, a column of 5 mm in diameter and 7 mm in height was cut out from the flexual test piece along the machine direction from its center, and the linear thermal expansion coefficient in the machine direction was measured in the temperature range of 30°–180° C.

The plating test pieces were treated according to said process, and the average roughness Ra of the surface after etching (conducted under the conditions of 70° C. and 20-minute dipping) was measured. Also, the appearance after etching was observed visually, and the adhesive strength was determined according to JIS C6481 (90° peeling at a rate of 50 mm/min).

For the evaluation of thermal stability in the molten state, a comparison was made between melt viscosity after 5-minute retention and that after 30-minute retention in a Kouka-type flow tester (mfd. by Shimadzu Corp.) under the conditions of 400° C., a load of 50 kg/cm$^2$, nozzle diameter of 1 mm and land length of 10 mm.

The results are shown in Table 1.

The test pieces of any of the compositions used showed high tensile strength, flexual modulus of elasticity, impact strength, heat distortion temperature, low linear thermal expansion coefficient and excellent thermal stability in the molten state. Further, all of the test pieces presented a beautiful appearance after etching and admirable surface smoothness and showed high adhesive strength.

When the circuits with a line width of 0.2 mm were formed by said method on the plated test pieces of the compositions of Examples 1, 5 and 10, the results were excellent.

COMPARATIVE EXAMPLES 1-4

Polyether sulfone VICTREX® PES 3600P, wollastonite TW-HAR-10 and dolomite were mixed in the amount ratios shown in Table 1, and the mixtures were treated in the same manner as in Examples 1-11 to prepare the test pieces. The test pieces were subjected to said items of testing to obtain the results shown in Table 1.

The test piece of the composition with less than 3% by weight of wollastonite (Comparative Example 1) produced little reinforcing effect for flexual modulus of elasticity and also no significant improving effect for linear thermal expansion coefficient as compared with the single body of aromatic polysulfone, while the test piece of the composition with more than 40% by weight of wollastonite (Comparative Example 2) was bad in appearance of the molded product and plating surface.

On the other hand, the test piece of the composition with less than 3% by weight of alkaline earth metal carbonate (dolomite was used in this case) (Comparative Example 3) was unsatisfactory in adhesive strength to the plating. The test piece of the composition with more than 30% by weight of dolomite (Comparative Example 4) was very low in tensile strength and Izot impact strength. It also suffered an excessive change of melt viscosity during retention and was poor in thermal stability during working. The molded article obtained from this composition had silver streaks on the surface and was very poor in surface appearance after plating.

COMPARATIVE EXAMPLES 5 and 6

The same operations were carried out with the same compositions as in Examples 1 and 6 except for use of wollastonite of such a type that about 35% was unpassable through a 300-mesh screen (NYAD® G, sold by Nagase & Co., Ltd.). The results are shown in Table 1.

There were obtained, in both cases, the same results as Examples 1 and 6 in mechanical properties, thermal properties and thermal stability during processing, but in these cases, the surface roughness Ra of the plating after etching was very large, the surface appearance of the plating was poor, and the adhesive strength was dispersed. When the circuits were formed by using the plated test pieces, it was impossible to form the good circuits with a line width smaller than 1.0 mm.

EXAMPLES 12–17 AND COMPARATIVE EXAMPLES 7–10

Aromatic polysulfone having the repeating structural units of

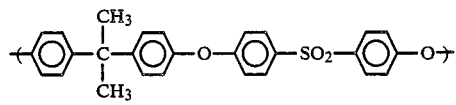

(Udel® P-1700 by AMOCO Cos., reduced viscosity: 0.42), wollastonite and alkaline earth metal carbonate were mixed in the amount ratios shown in Table 2, and the test pieces were prepared from the respective mixtures in the same way as in Examples 1–11 except that the pelletization temperature was set at 290°–310° C. and the cylinder temperature in injection molding was adjusted to 330°–350° C., the test pieces being then subjected to the same testing as in said Examples. The results are shown in Table 2.

In each case, there were obtained the same results as when the polyether sulfone was used.

EXAMPLES 18–20

The test pieces for examining plating characteristics were prepared in the same way as in Examples 1–11 by using the same compositions as used in Examples 3, 6 and 10, and these test pieces were plated. In these cases, etching was conducted at temperatures of 60° C. and 85° C. with dipping time of 10 minutes and 30 minutes. The surface roughness Ra after etching was measured, the appearance after plating was visually observed and the adhesive strength was determined in the same way as in Examples 1–12. The results are shown in Table 3.

In all cases, the appearance was beautiful, the surface smoothness was excellent and the adhesive strength was high.

COMPARATIVE EXAMPLES 11–14

The test pieces were prepared from the same procedures as in Examples 1–11 by using the same aromatic polysulfone as used in Examples 1–11, either calcium carbonate or dolomite as alkaline earth metal carbonate, and either potassium titanate fiber with a free potassium content of 0.28% by weight (Tismo® D by Otsuka Chemical Co., Ltd.) or the one with a free potassium content of 0.03% by weight (HT-200 by Titan Kogyo K.K.), and these test pieces were subjected to the measurements of tensile strength, flexual modulus of elasticity, Izot impact strength, heat distortion temperature, thermal stability during processing (change of melt viscosity in retention) and plating characteristics (adhesive strength and visual appearance of the plating). Etching was conducted by 30-minute dipping at 80° C. The results are shown in Table 4.

The compositions using potassium titanate fiber with a free potassium content of 0.28% by weight (Comparative Examples 11 and 12), as compared with the compositions using potassium titanate fiber with a free potassium content of 0.03% by weight (Comparative Examples 13 and 14), cause gelation as the retention time elongated during injection molding, resulting in an excessive rise of melt viscosity or incapability of further extrusion. In injection molding under the condition of relatively short retention time, molding was possible and no excessive deterioration of properties was seen, but the molded product had a mark of gelation on the surface and was poor in surface smoothness and in visual appearance after plating. Also, a decrease of adhesive strength was noted.

For the compositions of Comparative Examples 13 and 14, their plating characteristics were examined by conducting etching at temperatures of 65° C., 70° C., 75° C. and 85° C. with dipping times of 10 minutes and 30 minutes and by visually observing the appearance of the molded product after plating and measuring its adhesion strength. The results are shown in Table 5.

In case the etching temperature was 65° C., no satisfactory adhesive strength was obtained even with 30-minute dipping. Also, even when the etching temperature was raised to 70° C., there could be obtained no sufficient adhesive strength with 10-minute dipping. In case etching was conducted at 75° C. and 85° C., the adhesive strength was rather low when the dipping time was 10 minutes. In the case of 85° C. and 30-minute dipping, some surface roughening was seen in appearance after plating.

As seen from the above, in the case of the compositions consisting of aromatic polysulfone, potassium titanate fiber and alkaline earth metal carbonate, even though the thermal stability in the molten state was improved by reducing the free potassium content in said potassium titanate fiber, it is necessary to use the higher etching temperature than that required for the composition of this invention for obtaining the satisfactory adhesive strength, and also the range of etching temperature suited therefor is very limited.

Said free potassium content was determined by boiling a prescribed amount of said potassium titanate fiber in water for 20 hours and then measuring the eluate by a flame and atomic-absorption spectroscopic analyzer (double-beam type, Model 650 mfd. by Shimadzu Corp.; measuring wavelength: 7,665 Å).

TABLE 1

| | Composition (wt %) | | Mechanical properties | | |
|---|---|---|---|---|---|
| Poly-ether | Wollastonite | Alkaline earth metal carbonate | Tensile Strength | Flexural modulus of elasticity | Izot impact strength |

TABLE 1-continued

| | sulfone | Type | Amount | Type | Amount | (kg/cm²) | (kg/cm²) | (kg · cm/cm) |
|---|---|---|---|---|---|---|---|---|
| Example 1 | 85 | TW-HAR-10 | 10 | Calcium carbonate | 5 | 900 | 48000 | 35 |
| Example 2 | 70 | " | 20 | Calcium carbonate | 10 | 910 | 69000 | 29 |
| Example 3 | 60 | " | 20 | Calcium carbonate | 20 | 910 | 77000 | 23 |
| Example 4 | 60 | " | 30 | Calcium carbonate | 10 | 950 | 82000 | 25 |
| Example 5 | 60 | " | 20 | Dolomite | 20 | 920 | 65000 | 24 |
| Example 6 | 60 | " | 30 | Dolomite | 10 | 970 | 67000 | 29 |
| Example 7 | 60 | " | 20 | Magnesium carbonate | 20 | 910 | 68000 | 23 |
| Example 8 | 60 | " | 30 | Magnesium carbonate | 10 | 940 | 7000 | 28 |
| Example 9 | 60 | NYAD ® 400 | 30 | Calcium carbonate | 10 | 940 | 83000 | 24 |
| Example 10 | 60 | " | 30 | Dolomite | 10 | 950 | 69000 | 30 |
| Example 11 | 60 | KEMOLIT ® ASB-3 | 30 | Dolomite | 10 | 930 | 67000 | 30 |
| Comp. Ex. 1 | 83 | TW-HAR-10 | 2 | Dolomite | 15 | 780 | 38000 | 18 |
| Comp. Ex. 2 | 50 | " | 45 | Dolomite | 5 | 990 | 85000 | 12 |
| Comp. Ex. 3 | 78 | " | 20 | Dolomite | 2 | 980 | 56000 | 28 |
| Comp. Ex. 4 | 55 | " | 10 | Dolomite | 35 | 620 | 49000 | 8 |
| Comp. Ex. 5 | 85 | NYAD ® G | 10 | Calcium carbonate | 5 | 920 | 52000 | 38 |
| Comp. Ex. 6 | 60 | " | 30 | Dolomite | 10 | 990 | 75000 | 31 |

| | Thermal properties | | Thermal stability during processing | | Plating characteristics | | |
|---|---|---|---|---|---|---|---|
| | Heat distortion temp. (°C.) | Linear thermal expansion coefficient × 10⁻⁵ (1/C) | Melt viscosity (poises) 5-minute retention | 30-minute retention | Surface roughness after etching Ra (μm) | Adhesive strength (kg/cm) | Appearance of the plating |
| Example 1 | 205 | 3.9 | 2100 | 3500 | 2.2 | 1.2 | Splendid |
| Example 2 | 207 | 3.3 | 2900 | 4300 | 2.5 | 1.4 | " |
| Example 3 | 208 | 2.3 | 4700 | 6000 | 2.7 | 1.6 | Excellent |
| Example 4 | 208 | 2.2 | 4100 | 5500 | 2.6 | 1.5 | " |
| Example 5 | 209 | 2.7 | 5100 | 6200 | 2.5 | 1.8 | " |
| Example 6 | 210 | 2.4 | 5000 | 5900 | 2.4 | 1.7 | Splendid |
| Example 7 | 208 | 2.5 | 4500 | 5300 | 2.8 | 1.8 | Good |
| Example 8 | 210 | 2.3 | 4800 | 5600 | 2.7 | 1.6 | Excellent |
| Example 9 | 209 | 2.2 | 4500 | 5900 | 2.5 | 1.5 | " |
| Example 10 | 209 | 2.4 | 4900 | 6300 | 2.6 | 1.6 | " |
| Example 11 | 210 | 2.4 | 4800 | 6000 | 2.6 | 1.5 | " |
| Comp. Ex. 1 | 203 | 4.7 | 3200 | 4100 | 2.4 | 1.3 | Excellent |
| Comp. Ex. 2 | 211 | 1.8 | 6800 | 9700 | 4.4 | 0.8 | Bad |
| Comp. Ex. 3 | 208 | 3.6 | 4200 | 5000 | 1.8 | 0.4 | Splendid |
| Comp. Ex. 4 | 205 | 2.6 | 6700 | >10000 | 4.2 | 0.6 | Bad |
| Comp. Ex. 5 | 206 | 3.6 | 3300 | 4800 | 3.6 | 0.8 | " |
| Comp. Ex. 6 | 211 | 2.2 | 5600 | 6800 | 4.3 | 0.4 | " |

TABLE 2

| | Composition (wt %) | | | | Mechanical properties | | Thermal properties |
|---|---|---|---|---|---|---|---|
| | Poly-sulfone | Wolastonite Type | Amount | Alkaline earth metal carbonate Type | Amount | Tensile strength (kg/cm²) | Flexural modulus of elasticity (kg/cm²) | Heat distortion temp. (°C.) |
| Example 12 | 85 | TW-HAR-10 | 10 | Calcium carbonate | 5 | 760 | 48000 | 177 |
| Example 13 | 60 | " | 30 | Calcium carbonate | 10 | 810 | 82000 | 180 |
| Example 14 | 60 | " | 20 | Calcium carbonate | 20 | 790 | 7500 | 179 |
| Example 15 | 75 | NYAD ® 400 | 5 | Dolomite | 20 | 740 | 5800 | 177 |
| Example 16 | 55 | NYAD ® 400 | 35 | Dolomite | 10 | 830 | 85000 | 181 |
| Example 17 | 60 | NYAD ® 400 | 30 | Magnesium carbonate | 10 | 800 | 7700 | 180 |
| Comp. Example 7 | 83 | TW-HAR-10 | 2 | Dolomite | 15 | 650 | 44000 | 176 |
| Comp. Example 8 | 78 | " | 20 | Dolomite | 2 | 800 | 69000 | 178 |
| Comp. Example 9 | 60 | NYAD ® G | 30 | Calcium carbonate | 10 | 850 | 83000 | 180 |
| Comp. Example 10 | 60 | " | 20 | Dolomite | 20 | 820 | 7800 | 179 |

TABLE 2-continued

|  | Thermal stability during processing | | Plating characteristics | |
|---|---|---|---|---|
|  | Melting viscosity (poises) | | | Appearance |
|  | 5-minute retention | 30-minute retention | Adhesive strength (kg/cm) | of the plating |
| Example 12 | 1600 | 2200 | 1.3 | Splendid |
| Example 13 | 3200 | 4400 | 1.5 | Excellent |
| Example 14 | 3400 | 4800 | 1.6 | " |
| Example 15 | 2000 | 3600 | 1.7 | " |
| Example 16 | 3400 | 4900 | 1.6 | Good |
| Example 17 | 3300 | 4100 | 1.8 | Excellent |
| Comp. Example 7 | 1800 | 3100 | 1.6 | Excellent |
| Comp. Example 8 | 3100 | 4300 | 0.4 | " |
| Comp. Example 9 | 3500 | 5100 | 0.5 | Bad |
| Comp. Example 10 | 3600 | 5500 | 0.6 | " |

TABLE 3

|  | Composition | Etching conditions | | Plating characteristics | | |
|---|---|---|---|---|---|---|
|  |  | Temp. (°C.) | Dipping time (min) | Surface roughness after etching Ra (μm) | Adhesive strength (kg/cm) | Appearance of the plating |
| Example 18 | Same as Example 3 | 60 | 10 | 2.2 | 1.5 | Excellent |
|  |  | 60 | 30 | 2.5 | 1.7 | " |
|  |  | 85 | 10 | 2.9 | 2.0 | " |
|  |  | 85 | 30 | 3.2 | 1.8 | " |
| Example 19 | Same as Example 6 | 60 | 10 | 2.1 | 1.4 | Splendid |
|  |  | 60 | 30 | 2.4 | 1.7 | " |
|  |  | 85 | 10 | 2.8 | 2.2 | " |
|  |  | 85 | 30 | 3.5 | 1.7 | " |
| Example 20 | Same as Example 10 | 60 | 10 | 2.1 | 1.3 | Splendid |
|  |  | 60 | 30 | 2.5 | 1.6 | " |
|  |  | 85 | 10 | 2.8 | 2.1 | Excellent |
|  |  | 85 | 30 | 3.5 | 1.7 | " |

TABLE 4

|  | Composition (wt %) | | | | Mechanical properties | | |
|---|---|---|---|---|---|---|---|
|  | Polyether sulfone | Calcium carbonate | Dolomite | Potassium titanate fiber | Tensile strength (kg/cm$^2$) | Flexual modulus of elasticity (kg/cm$^2$) | Izot impact strength (unnotched) (kg · cm/cm) |
| Comp. Example 11 | 80 | 10 | — | 10 | 880 | 41000 | 43 |
| Comp. Example 12 | 65 | — | 10 | 25 | 770 | 65000 | 31 |
| Comp. Example 13 | 80 | 10 | — | 10 | 920 | 43000 | 49 |
| Comp. Example 14 | 65 | — | 10 | 25 | 950 | 70000 | 55 |

|  | Heat distortion temp. (°C.) | Melt viscosity (poises) | | Plating characteristics | |
|---|---|---|---|---|---|
|  |  | 5-minute retention | 30-minute retention | Appearance of the plating | Adhesive strength (kg · cm/cm) |
| Comp. Example 11 | 209 | 920 | 3800 | Good | 1.0 |
| Comp. Example 12 | 214 | 2350 | Unextrudable | Bad | 0.9 |
| Comp. Example 13 | 210 | 860 | 900 | Splendid | 1.6 |
| Comp. Example 14 | 218 | 1100 | 1140 | Excellent | 1.8 |

TABLE 5

| Composition | Etching conditions | | Plating characteristics | |
|---|---|---|---|---|
|  | Temp. (°C.) | Dipping time (min) | Adhesive strength (kg/cm) | Appearance of the plating |
| Same as | 65 | 10 | 0.4 | Splendid |
| Comp. | 65 | 30 | 0.6 | " |

TABLE 5-continued

| Composition | Etching conditions | | Plating characteristics | |
|---|---|---|---|---|
| | Temp. (°C.) | Dipping time (min) | Adhesive strength (kg/cm) | Appearance of the plating |
| Example 13 | 70 | 10 | 0.7 | " |
| | 70 | 30 | 1.3 | " |
| | 75 | 10 | 1.1 | " |
| | 75 | 30 | 1.6 | " |
| | 85 | 10 | 1.2 | " |
| | 85 | 30 | 1.4 | Good |
| Same as Comp. Example 14 | 65 | 10 | 0.5 | Excellent |
| | 65 | 30 | 0.8 | " |
| | 70 | 10 | 0.9 | " |
| | 70 | 30 | 1.4 | " |
| | 75 | 10 | 1.1 | " |
| | 75 | 30 | 1.7 | Splendid |
| | 85 | 10 | 1.1 | Excellent |
| | 85 | 30 | 1.5 | Good |

What is claimed is:

1. An aromatic polysulfone resin composition with excellent plating characteristics comprising:
   (A) 50 to 90% by weight of an aromatic polysulfone,
   (B) 3 to 40% by weight of wollastonite of which 90% by weight or more of the total amount have a particle size smaller than 300 meshes, and
   (C) 3 to 30% by weight of an alkaline earth material carbonate.

2. An aromatic polysulfone resin composition according to claim 1, wherein the aromatic polysulfone consists of one of the following repeating structural units (1)–(16):

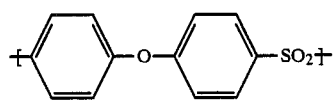

(1)

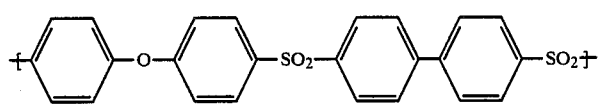

(2)

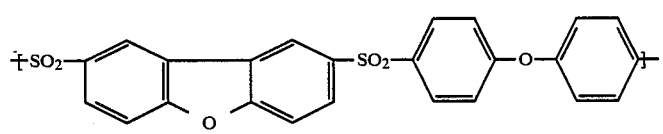

(3)

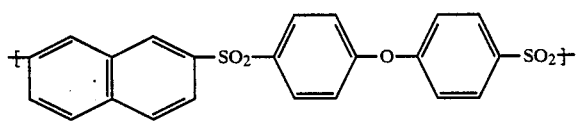

(4)

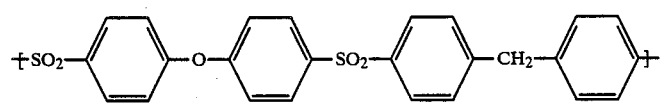

(5)

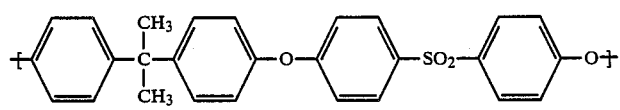

(6)

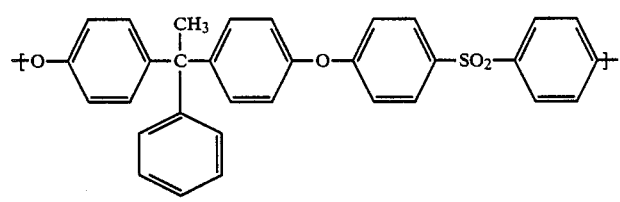

(7)

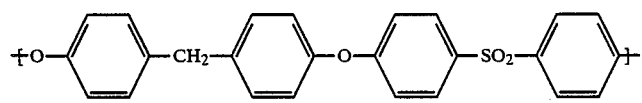

(8)

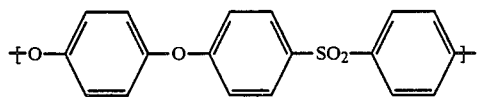

(9)

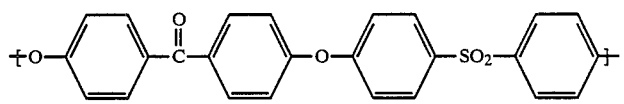

(10)

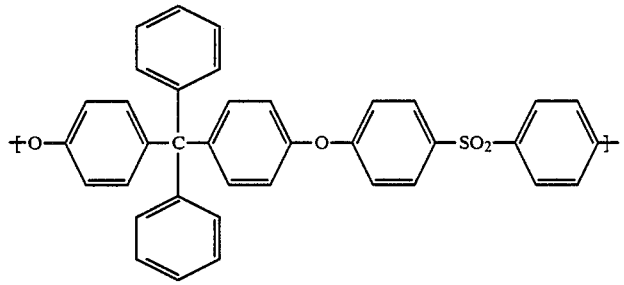

(11)

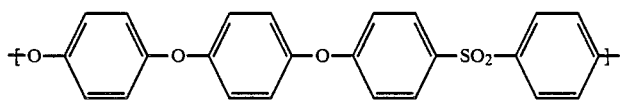

(12)

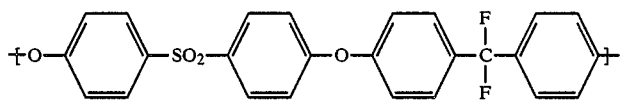

(13)

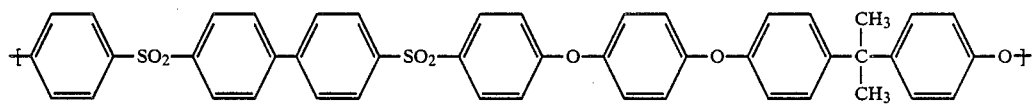

(14)

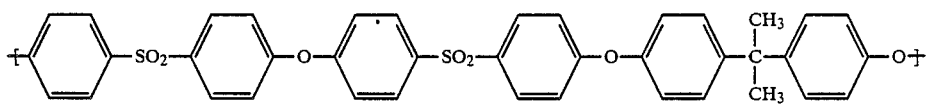

(15)

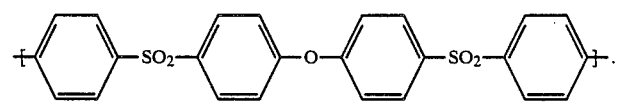

(16)

3. An aromatic polysulfone resin composition according to claim 2, wherein the aromatic polysulfone consists of the repeating structural units (1), (2) or (6).

4. An aromatic polysulfone resin composition according to claim, 2, wherein the aromatic polysulfone consists of the repeating structural units (1) or (6).

5. An aromatic polysulfone resin composition according to claim 1, wherein the reducing viscosity of the aromatic polysulfone as measured at 25° C. in a solution containing 1 g of aromatic polysulfone in 100 ml of N,N-dimethylformamide is 0.3 to 0.6.

6. An aromatic polysulfone resin composition according to claim 1, wherein the alkaline earth metal carbonate is one or two members selected from the group consisting of calcium carbonate, magnesium carbonate and an eutectic mixture of calcium carbonate and magnesium carbonate.

7. An aromatic polysulfone resin composition according to claim 1, wherein the content of aromatic polysulfone is 55 to 85% by weight.

8. An aromatic polysulfone resin composition according to claim 1, wherein the content of wollastonite is 10 to 30% by weight.

9. An aromatic polysulfone resin composition according to claim 1, wherein the content of alkaline earth metal carbonate is 5 to 20% by weight.

10. An aromatic polysulfone resin composition according to claim 1, wherein the combined content of the wollastonite of which 90% by weight or more of the total amount have a particle size smaller than 300 meshes and the alkaline earth metal carbonate is 10 to 50% by weight.

* * * * *